(12) United States Patent
Cremonesi et al.

(10) Patent No.: US 6,221,717 B1
(45) Date of Patent: Apr. 24, 2001

(54) EEPROM MEMORY CELL COMPRISING A SELECTION TRANSISTOR WITH THRESHOLD VOLTAGE ADJUSTED BY IMPLANTATION, AND RELATED MANUFACTURING PROCESS

(75) Inventors: Carlo Cremonesi, Vaprio d'Adda; Bruno Vajana, Bergamo; Roberta Bottini, Lissone; Giovanna Dalla Libera, Monza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/406,879

(22) Filed: Sep. 28, 1999

(30) Foreign Application Priority Data

Sep. 29, 1998 (IT) .............................................. MI98A2082

(51) Int. Cl.$^7$ .................................................. H01L 21/336
(52) U.S. Cl. ........................... 438/258; 438/266; 438/283
(58) Field of Search ................................... 438/257, 258, 438/264, 199, 200, 201, 211, 217, 241, 266, 283, 289

(56) References Cited

U.S. PATENT DOCUMENTS

| | | | |
|---|---|---|---|
| 5,559,049 | * 9/1996 | Cho | 437/44 |
| 5,610,430 | * 3/1997 | Yamashita et al. | 257/412 |
| 5,976,935 | * 11/1999 | Lin et al. | 438/264 |
| 5,981,340 | * 11/1999 | Chang et al. | 438/258 |

\* cited by examiner

*Primary Examiner*—Matthew Smith
*Assistant Examiner*—Lex A. Malsawma
(74) *Attorney, Agent, or Firm*—Wolf, Greenfield & Sacks, P.C.; James H. Morris; Theodore E. Galanthay

(57) ABSTRACT

Process for manufacturing of an integrated structure including at least one circuitry transistor and at least one non-volatile EEPROM memory cell with relative selection transistor, including at least a first stage of growth and definition of a gate oxide layer on a silicon substrate, a second stage of definition of a tunnel oxide region in said gate oxide layer, a third stage of deposition and definition of a first polysilicon layer on said gate oxide layer and on said tunnel oxide region, a fourth stage of growth and definition of an intermediate dielectric layer on said first polysilicon layer, a fifth stage of selective etching and removal of said dielectric intermediate layer in a region for said circuitry transistor, a sixth stage of ionic implantation of a dopant with a first type of conductivity in order to introduce said dopant into a channel region for said circuitry transistor in order to adjust its threshold voltage, a seventh stage of deposition and definition of a second polysilicon layer on said integrated structure, an eighth stage of selective etching and removal of said second polysilicon layer in a region for said memory cell, and of said first and second polysilicon layers in said region for said circuitry transistor in order to form said circuitry transistor, and a ninth stage of selective etching and removal of said intermediate dielectric layer and of said first polysilicon layer in said region for said memory cell, wherein during said fifth stage said intermediate dielectric layer is etched and removed also in a region that is destined to form a channel of said selection transistor, and said sixth stage of ionic implantation therefore allows to introduce said dopant into said channel region and therefore to increase the threshold voltage of said selection transistor.

9 Claims, 2 Drawing Sheets

EEPROM MEMORY CELL COMPRISING A SELECTION TRANSISTOR WITH THRESHOLD VOLTAGE ADJUSTED BY IMPLANTATION, AND RELATED MANUFACTURING PROCESS

BACKGROUND OF THE INVENTION

1. Field of the Invention

The present invention relates to an EEPROM memory cell comprising a selection transistor with threshold voltage adjusted by proper ionic implantation, and related manufacturing process.

2. Discussion of the Related Art

A non-volatile EEPROM memory cell includes a polysilicon floating gate that is superimposed on a layer of gate oxide, superimposed in turn on a properly doped silicon substrate, and a control gate also of polysilicon, superimposed on the floating gate and electrically insulated from the latter by means of an intermediate dielectric layer (usually ONO, with a possible thin layer of overlaid polysilicon).

The logic state of the cell is determined by the quantity of charge contained in the floating gate of the transistor. Traditional non-volatile memories are programmed in two logic states, a writing one and a reading one, in order to store one bit per cell. With EEPROM memories, the quantity of charge is altered by the flow of charges by tunnel effect through a thin layer of silicon oxide (tunnel oxide) that is interposed between the semiconductor substrate and the floating gate of the transistor, in an active region.

In FLOTOX EEPROM type memories, the floating gate extends laterally even beyond the tunnel oxide region.

A selection transistor, arranged in series, that can be made in various forms, for example, can be made of two superimposed layers of polysilicon, laid over the gate oxide with or without an interposed intermediate dielectric layer, or having a single polysilicon gate, is associated with the memory cell. In case an intermediate oxide layer is present between the two polysilicon layers, the selection transistor is structurally similar to the memory cell, and in any case it must provide for some short-circuit between the two polysilicon layers in opportune zones of the device. Generally there are also present other transistors that are part of the external circuitry.

EEPROM type non-volatile memory cells, usually made up of memory cells that are arranged by rows and columns in a matrix structure, allow electrically modifying the information contained in a cell of the matrix in the programming stage, both during the writing stage and during the erasing stage.

In addition, the information contained in each single cell can be modified in an independent way from the other cells. This feature is achieved by means of a selection transistor that is put in series with the transistor in which the information is stored. The selection transistor enables a determined cell that must be programmed or read.

The aforementioned memory cells can be made with an optimization of the available area, thanks to the application of manufacturing techniques that allow the self-alignment of the control gates and of the floating gates. Examples of such manufacturing processes are given by U.S. Pat. No. 4,766,088 and by EP-0,255,159, that solve even the possible problems connected with the undesirable holes in the silicon substrate as a consequence of etching stages for the definition of the transistor gates.

In the advanced processes in which the dimensions of the entire memory structure are considerably reduced, the threshold voltage of the selection transistor, which depends on the length of the transistor itself, becomes quite low. All this can create problems since it can be difficult that the selection transistor is off when one wishes that the relative cell is not selected. In the case of EEPROM memories, for example, there can be problems during the programming stage of a memory cell, when it is necessary that the cells belonging to a same column, but that must not be programmed, are not selected and therefore that the relative selection transistors are securely off, otherwise quite high currents can flow with consequent leakage problems.

The problem can be solved with a circuitry solution, but it is quite complicated as the same circuitry becomes much more complex.

The most effective solution seems to be the introduction of an implantation stage of the selection transistor, in order to increase the threshold voltage and to avoid the aforementioned problems. Such implantation, in the current manufacturing techniques for EEPROM memory devices, involves the introduction of an additional dedicated operation in the manufacturing process.

With reference to FIGS. 1 to 4, there are shown four stages of a CMOS process with DPCC flow (Double Polysilicon in Short Circuit) for the manufacturing of an EEPROM type memory cell, including also the selection transistor, and of a transistor of the external circuitry, according to the known art. After the growth of a gate oxide layer 2 on a silicon substrate 1 and the definition of a tunnel area 3 in correspondence of the future floating gate, a lower polysilicon layer 4, an intermediate dielectric layer 5 (for example ONO) and a thin polysilicon layer 6 are deposited. At this point selective etching and removal of the thin polysilicon layer 6 and of the intermediate dielectric layer 5 below is carried out by means of a mask 15, that leaves the portion destined to the matrix cell covered, so as to eliminate the above mentioned layers in the regions of the memory device in which it is intended to provide transistors of the external circuitry (FIG. 1).

The next stage provides for an implantation of the circuitry transistors by means of a mask 16 in order to define their threshold voltage (Low Voltage Shift implantation). In the matrix there is no need for any mask since there is present the intermediate dielectric layer 5 which prevents the flow of the dopant (for example boron) (FIG. 2).

Subsequently an upper polysilicon layer 7 and a silicide layer 8 are deposited on the entire device, and then a selective etching by means of a mask 17 and a consequent removal are carried out. An etching of this kind affects the silicide layer 8, the upper polysilicon layer 7 and the thin polysilicon layer 6 in the matrix, while in the external circuitry it affects the silicide layer 8 and the two polysilicon layers 7 and 4, as there is no intermediate dielectric layer 5 as in matrix (FIG. 3).

At this point a self-aligned etching of the intermediate dielectric layer 5 and of the lower polysilicon layer 4 in the matrix is carried out by means of a double-resist mask 18, so as to define the memory cell, including the selection transistor.

In FIG. 5 there is shown a memory cell that is obtained through the aforementioned process stages, in which the floating gate transistor 20 and the selection transistor 21, making up the cell itself, can be observed, and in addition an external circuitry transistor 22 is present. The two polysilicon layers of the selection transistor are short-circuited in opportune regions of the device.

In a thus structured process flow, a possible implantation of the selection transistor in order to obtain an increase of the threshold voltage involves the introduction of an additional step with a proper dedicated mask.

An object of the present invention is to provide an EEPROM memory cell comprising a selection transistor that is implanted so as to obtain an increase of the threshold voltage.

SUMMARY OF THE INVENTION

According to the present invention, this and other objects are attained by a manufacturing process for an integrated structure comprising at least one circuitry transistor and at least one non-volatile EEPROM memory cell with relative selection transistor, comprising at least a first stage of growth and definition of a gate oxide layer on a silicon substrate, a second stage of definition of a tunnel oxide region in said gate oxide layer, a third stage of deposition and definition of a first polysilicon layer on said gate oxide layer and on said tunnel oxide region, a fourth stage of growth and definition of an intermediate dielectric layer on said first polysilicon layer, a fifth stage of selective etching and removal of said dielectric intermediate layer in a region for said circuitry transistor, a sixth stage of ionic implantation of a dopant with a first type of conductivity in order to introduce said dopant into a channel region for said circuitry transistor in order to adjust its threshold voltage, a seventh stage of deposition and definition of a second polysilicon layer on said integrated structure, an eighth stage of selective etching and removal of said second polysilicon layer in a region for said memory cell, and of said first and second polysilicon layers in said region for said circuitry transistor in order to form said circuitry transistor, and a ninth stage of selective etching and removal of said intermediate dielectric layer and of said first polysilicon layer in said region for said memory cell in order to obtain a floating gate transistor and said selection transistor, wherein during said fifth stage said intermediate dielectric layer is etched and removed also in a region destined to form a channel of said selection transistor, and said sixth stage of ionic implantation then allows introduction of said dopant into said channel region and therefore to increase the threshold voltage of said selection transistor.

BRIEF DESCRIPTION OF THE DRAWINGS

The characteristics and the advantages of the present invention will become evident from the following detailed description of an embodiment thereof, that is illustrated as a non limiting example in the enclosed drawings, in which.

DETAILED DESCRIPTION

Figure 1:
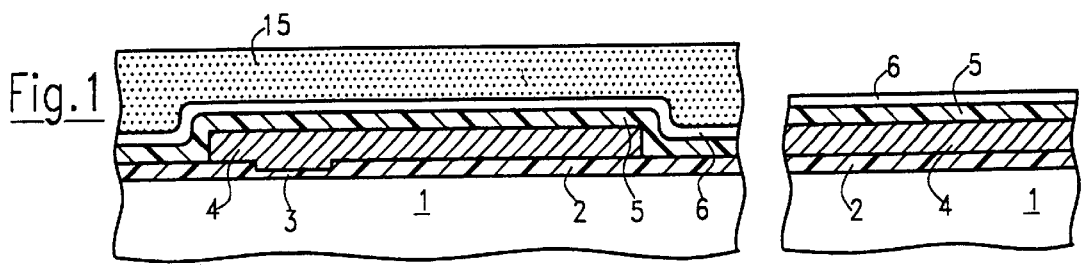
FIGS. 1 to 4 schematically show some manufacturing phases of a non-volatile memory cell and of an external circuitry transistor, according to the known art.
Figure 2:
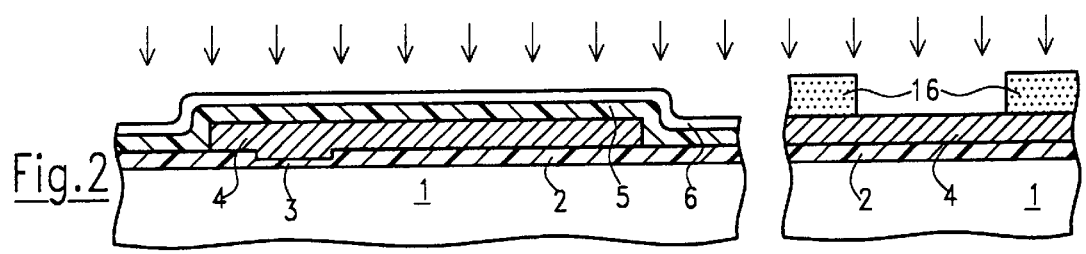
Figure 3:
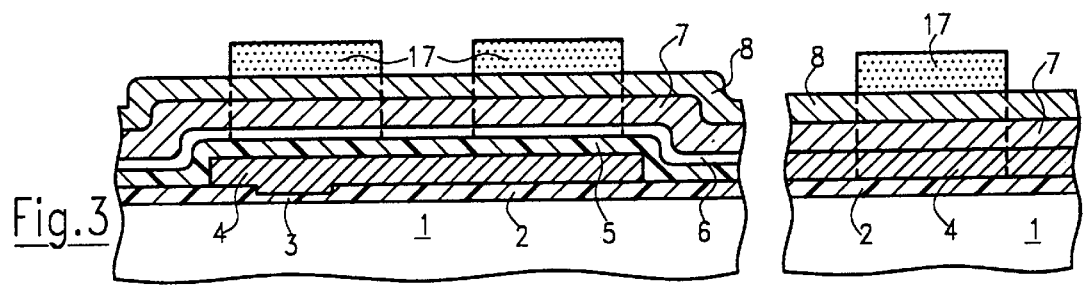
Figure 4:
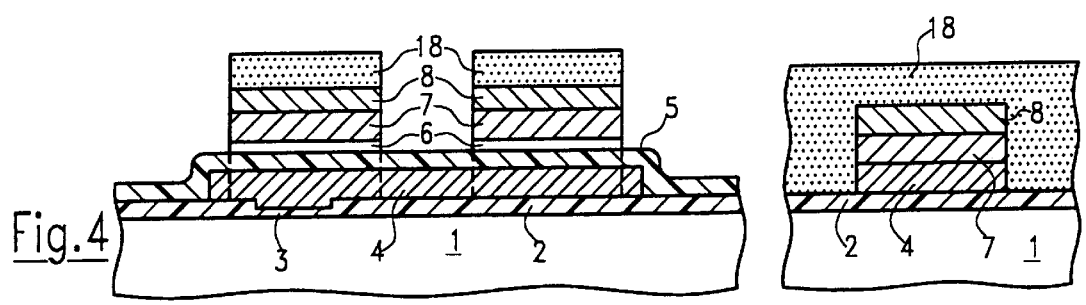
Figure 5:
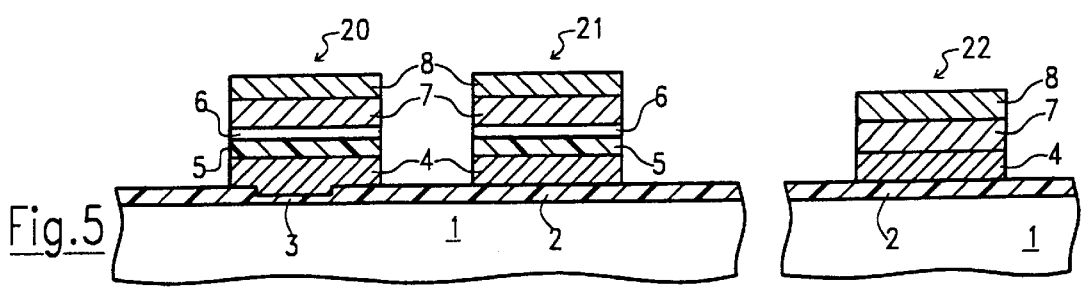
FIG. 5 shows a non-volatile memory cell and an external circuitry transistor, according to the known art.
Figure 6:
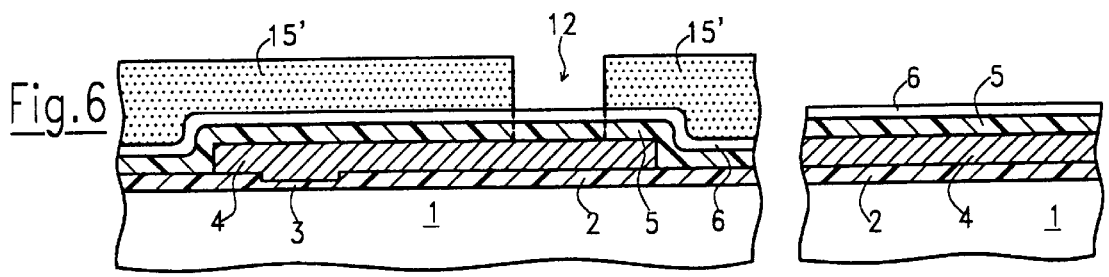
FIGS. 6 to 9 schematically show some manufacturing phases of a non-volatile memory cell and of an external circuitry transistor, according to the present invention.

FIG. 6 shows a stage of selective etching and removal of the thin polysilicon layer 6 and of the intermediate dielectric layer 5 below by means of a modified mask 15' that comprises an opening 12 in correspondence of the matrix selection transistor. As compared with the known art, therefore also the thin polysilicon layer 6 and the intermediate dielectric layer 5 are removed along a strip of the matrix in which the selection transistors will be realized.

Figure 7:
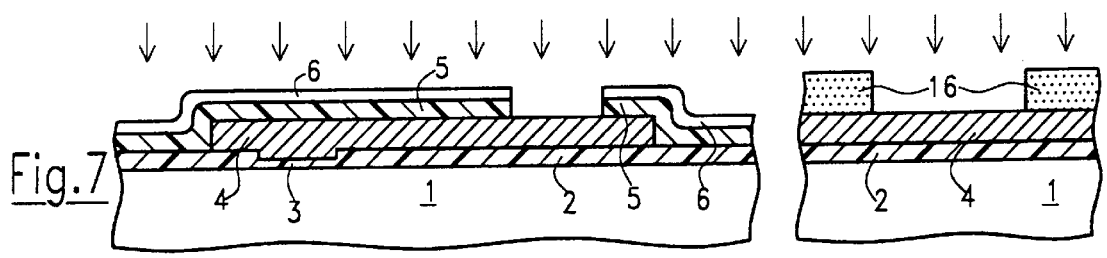

In this way, at the moment of the Low Voltage Shift implantation of the circuitry transistors, the dopant (for example boron) also passes through the selection transistor in the matrix and gets to a depth such as to vary its threshold voltage, and in particular to lower it (FIG. 7).

Figure 8:
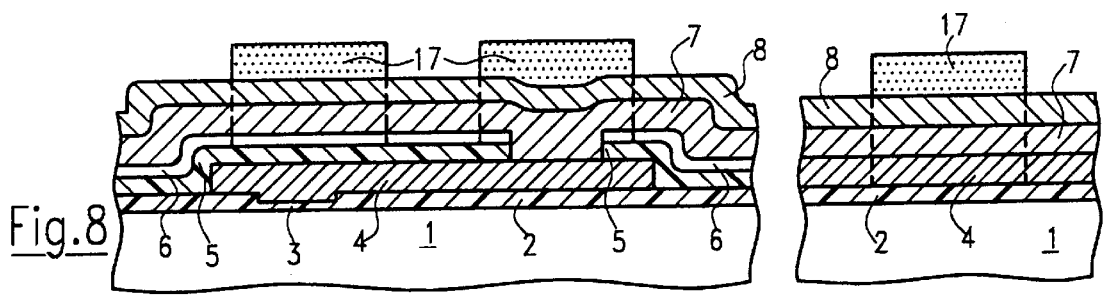
Figure 9:
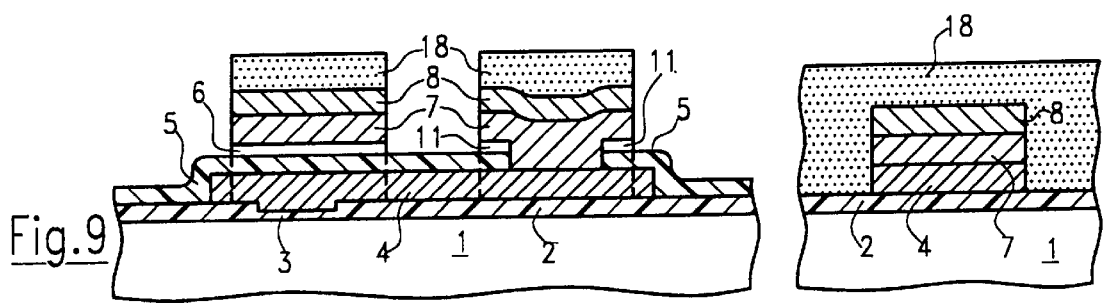
Figure 10:
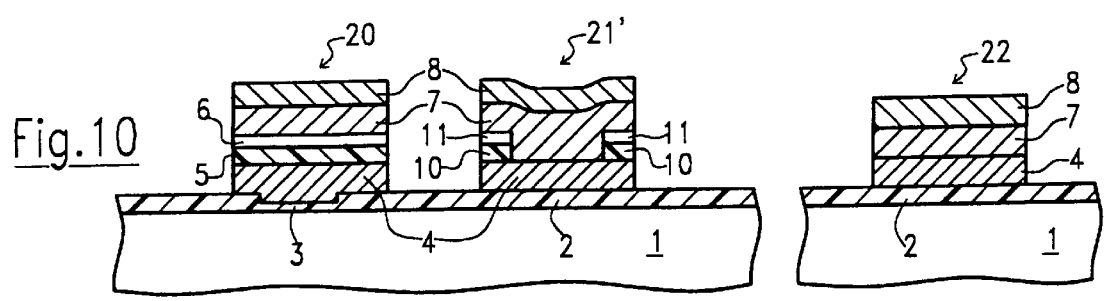
FIG. 10 shows a non-volatile memory cell and an external transistor, according to the present invention.

The next manufacturing stages (FIGS. 8 and 9) remain unchanged with respect to the known art. With reference to FIG. 10 it is possible to observe that in the final structure the selection transistor 21' does not show any more the intermediate dielectric layer 5 and the thin polysilicon layer 6, but it has side fins 10 and 11, respectively of the one and the other. This is because the opening of the modified mask 15' is narrower than the mask 17 utilized during the selective etching of the silicide layer 8 and of the upper polysilicon layer 7, so as to prevent disalignment problems when carrying out the self-aligned etching of the intermediate dielectric 5 and of the lower polysilicon 4 in the matrix (FIG. 9).

A solution of this type allows implantation of the selection transistor while maintaining the threshold voltage of the cell unaltered, by modifying an already existing manufacturing mask without having to add an operation to the process flow since the implantation is carried out at the same time as the Low Voltage Shift implantation of the circuitry transistors, which is made to define their threshold voltage. In addition, the implantation in question does not undergo a diffusion due to the thermal treatment for the growth of the intermediate dielectric (ONO).

The definition of the width of the strips that are open in the matrix must be executed with accuracy in order to prevent disalignment problems when the self-aligned etching is carried out.

The implantation for the variation of the threshold voltage could involve also the floating gate transistor 20, by utilizing a different modified mask with openings on the same transistor.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for manufacturing an integrated structure comprising at least one circuitry transistor and at least one non-volatile EEPROM memory cell with relative selection transistor, comprising at least a first stage of growth and definition of a gate oxide layer on a silicon substrate, a second stage of definition of a tunnel oxide region in said gate oxide layer, a third stage of deposition and definition of a first polysilicon layer on said gate oxide layer and on said tunnel oxide region, a fourth stage of growth of an intermediate dielectric layer on said first polysilicon layer, a fifth stage of selective etching and removal of said dielectric intermediate layer in a region for said circuitry transistor, a sixth stage of ionic implantation of a dopant with a first type of conductivity in order to introduce said dopant into a channel region for said circuitry transistor in order to adjust its threshold voltage, a seventh stage of deposition and definition of a second layer of polysilicon on said integrated structure, an eighth stage of selective etching and removal of said second polysilicon layer in a region for said memory cell, and of said first and second polysilicon layers in said region for said circuitry transistor in order to form said circuitry transistor, and a ninth stage of selective etching and removal of said intermediate dielectric layer and of said first polysilicon layer in said region for said memory cell, wherein during said fifth stage a mask with an opening on a channel region of said selection transistor is used for etching and removing said intermediate dielectric layer also in said channel region that is destined to form a channel of a second type of conductivity for said selection transistor, and said sixth stage of ionic implantation therefore allows to introduce said dopant into said channel region and therefore to increase the threshold voltage of said selection transistor.

2. Process according to claim 1, wherein said first type of conductivity is of P type and said second type of conductivity is of N type.

3. Process according to claim 2, wherein said dopant is boron.

4. Process according to claim 1, wherein said first type of conductivity is of N type and said second type of conductivity is of P type.

5. Process according to claim 1, wherein said intermediate dielectric layer comprises an oxide-nitride-oxide layer.

6. Process according to claim 1, further comprising, between said fourth stage and said fifth stage, a deposition stage of a thin polysilicon layer, said thin polysilicon layer being etched and removed during said fifth stage, in the same way as said intermediate dielectric layer.

7. Process according claim 1, wherein after said seventh stage a stage of deposition of a silicide layer on said second polysilicon layer is provided, said silicide layer being etched and removed in the subsequent eighth stage, in the same way as said second polysilicon layer.

8. Semiconductor memory device comprising an integrated structure manufactured by a process according to claim 1, comprising a floating gate transistor formed by two polysilicon layers overlaid on an oxide gate layer superimposed in turn to a silicon substrate and comprising a tunnel oxide region in said gate oxide layer, said polysilicon layers being electrically isolated by means of an intermediate dielectric layer interposed between them, a circuitry transistor structurally similar to said floating gate transistor but comprising no intermediate dielectric layer between the two polysilicon layers and no tunnel oxide region, characterised in that it comprises a selection transistor comprising two polysilicon layers superimposed on said gate oxide layer and short-circuited each other, and a channel region in said silicon substrate with a greater dopant concentration than said silicon substrate so as to have an increased voltage threshold.

9. Device according to claim 8, further comprising intermediate dielectric fins between said two polysilicon layers of said selection transistor.

* * * * *